United States Patent
Yang et al.

(10) Patent No.: US 10,522,741 B1
(45) Date of Patent: Dec. 31, 2019

(54) UNDER-CUT VIA ELECTRODE FOR SUB 60NM ETCHLESS MRAM DEVICES BY DECOUPLING THE VIA ETCH PROCESS

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 4 days.

(21) Appl. No.: 16/008,650

(22) Filed: Jun. 14, 2018

(51) Int. Cl.
| | |
|---|---|
| *H01L 43/02* | (2006.01) |
| *H01L 43/10* | (2006.01) |
| *H01L 27/22* | (2006.01) |
| *H01L 43/12* | (2006.01) |
| *B82Y 25/00* | (2011.01) |

(52) U.S. Cl.
CPC ............ *H01L 43/02* (2013.01); *H01L 27/222* (2013.01); *H01L 43/10* (2013.01); *H01L 43/12* (2013.01); *B82Y 25/00* (2013.01)

(58) Field of Classification Search
CPC ......... H01L 43/12; H01L 43/02; H01L 43/08; H01L 43/10; H01L 27/222; H01F 10/3254; H01F 41/34; B82Y 25/00

USPC ........................................................ 257/421
See application file for complete search history.

(56) References Cited

U.S. PATENT DOCUMENTS

| | | | |
|---|---|---|---|
| 8,785,907 B2 | 7/2014 | Goel et al. | |
| 9,224,785 B2 * | 12/2015 | Do ........................ | H01L 27/222 |
| 9,773,978 B1 | 9/2017 | Fraczak et al. | |
| 2017/0110649 A1 | 4/2017 | Diaz et al. | |

* cited by examiner

*Primary Examiner* — Tu-Tu V Ho
(74) *Attorney, Agent, or Firm* — Haynes and Boone, LLP

(57) ABSTRACT

A method for fabricating a magnetic tunneling junction (MTJ) structure is described. A first dielectric layer is deposited on a bottom electrode and partially etched through to form a first via opening having straight sidewalls, then etched all the way through to the bottom electrode to form a second via opening having tapered sidewalls. A metal layer is deposited in the second via opening and planarized to the level of the first dielectric layer. The remaining first dielectric layer is removed leaving an electrode plug on the bottom electrode. MTJ stacks are deposited on the electrode plug and on the bottom electrode wherein the MTJ stacks are discontinuous. A second dielectric layer is deposited over the MTJ stacks and polished to expose a top surface of the MTJ stack on the electrode plug. A top electrode layer is deposited to complete the MTJ structure.

20 Claims, 2 Drawing Sheets

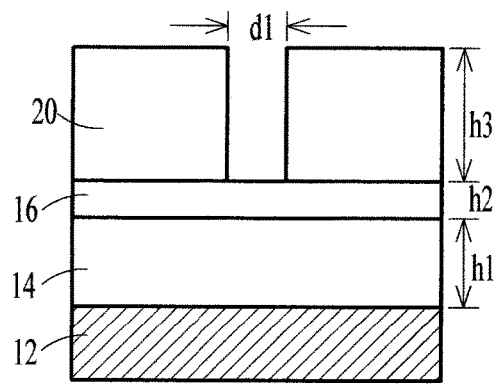
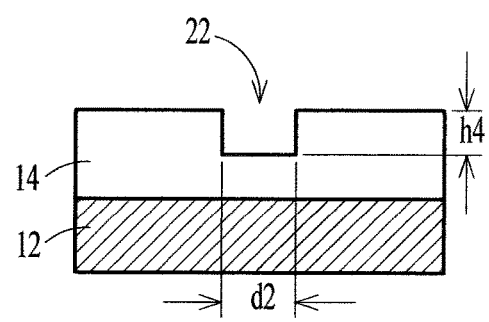
Figure 1
Figure 2
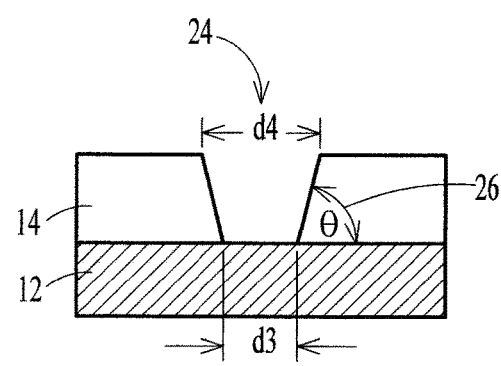
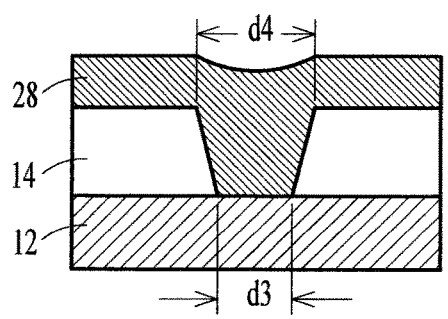
Figure 3
Figure 4

UNDER-CUT VIA ELECTRODE FOR SUB 60NM ETCHLESS MRAM DEVICES BY DECOUPLING THE VIA ETCH PROCESS

TECHNICAL FIELD

This application relates to the general field of magnetic tunneling junctions (MTJ) and, more particularly, to etchless methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of MTJ cells in each MRAM device and make them non-interacting to each other, precise patterning steps including reactive ion etching (RIE) are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance.

To solve this issue, pure physical etching techniques such as ion beam etching (IBE) have been applied to etch the MTJ stack to avoid the damaged MTJ sidewall. However, due to their non-volatile nature, IBE etched conductive materials in MTJ and the bottom electrode can be re-deposited into the tunnel barrier, resulting in shorted devices. A new device structure and associated process flow which can form MTJ patterns with desired sizes without plasma etch is desired.

Several patents teach methods of forming an MTJ without etching, including U.S. Pat. No. 9,773,978 (Fraczak et al) and U.S. Patent Application 2017/0110649 (Diaz et al), but these methods are different from the present disclosure.

SUMMARY

It is an object of the present disclosure to provide a method of forming MTJ structures without chemical damage or re-deposition of metal materials on the MTJ sidewalls.

Another object of the present disclosure is to provide a method of electrically isolatedly forming MTJ patterns on top of the bottom electrode without etching.

Another object of the present disclosure is to provide an undercut via bottom electrode and electrically isolatedly forming MTJ patterns on top of the bottom electrode without etching.

In accordance with the objectives of the present disclosure, a method for fabricating a magnetic tunneling junction (MTJ) structure is achieved. A first dielectric layer is deposited on a bottom electrode. The first dielectric layer is partially etched through to form a first via opening having straight sidewalls. Then, the first dielectric layer is etched all the way through to the bottom electrode in the first via opening to form a second via opening wherein the second via opening has tapered sidewalls wherein a top width of the second via opening is smaller than a bottom width of the second via opening. A metal layer is deposited over the first dielectric layer and in the second via opening and thereafter the metal layer overlying the first dielectric layer is removed. The remaining first dielectric layer is removed wherein the metal-filled second via opening forms an electrode plug on the bottom electrode. MTJ stacks are deposited on the electrode plug and on the bottom electrode wherein the MTJ stacks are discontinuous. A second dielectric layer is deposited over the MTJ stacks and polished to expose a top surface of the MTJ stack on the electrode plug. A top electrode layer is deposited on the second dielectric layer and contacting the top surface of the MTJ stack on the electrode plug to complete the MTJ structure.

Also in accordance with the objects of the present disclosure, an improved magnetic tunneling junction (MTJ) is achieved. The MTJ structure comprises a sub-60 nm MTJ device on an electrode plug, a bottom electrode underlying the electrode plug, and a top electrode overlying and contacting the MTJ stack.

BRIEF DESCRIPTION OF THE DRAWINGS

In the accompanying drawings forming a material part of this description, there is shown:

FIGS. 1 through 8 illustrate in cross-sectional representation steps in a preferred embodiment of the present disclosure.

DETAILED DESCRIPTION

Figure 5:
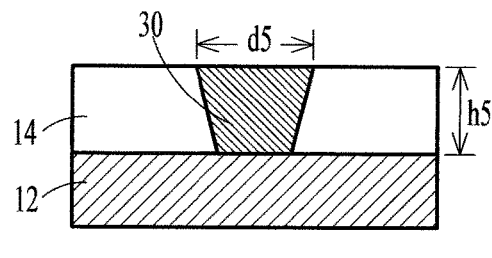

In the present disclosure, it is demonstrated that by decoupling the etch process, we can create a tapered dielectric via profile with a tunable sidewall angle. After later metal deposition and chemical mechanical polishing (CMP), an undercut via electrode can be formed. Assisted by high angle IBE or RIE trimming, the via's top and bottom sizes can decrease to sub 60 nm and 30 nm, respectively. After MTJ deposition, the same size of 60 nm MTJ patterns can be electrically isolatedly formed on top of the bottom electrode, without using a plasma or a physical etch. Consequently, chemical damage and/or conductive metal re-deposition on the MTJ sidewall are avoided, improving the MRAM device performance.

In a typical MTJ process, the MTJ stack is deposited onto a uniform sized bottom electrode. Plasma etch is used to transfer the photolithography created photoresist pattern into the MTJ stack. Physical etch induced metal re-deposition and/or chemical etch induced sidewall chemical damage cannot be avoided in this process. However, in the process of the present disclosure, the MTJ stack is deposited onto the undercut via electrode, so that the patterns are formed without etching, thus avoiding these issues.

The preferred embodiment of the present disclosure will be described in more detail with reference to FIGS. 1-8. FIG. 1 illustrates a bottom electrode layer 12 formed on a semiconductor substrate, not shown. First, on top of bottom electrode or circuit 12, a dielectric layer 14 such as $SiO_2$, SiN, SiON, SiC, SiCN or carbon is deposited using chemical vapor deposition (CVD) or spin-coating to a thickness h1 of ≥0.100 nm.

A bottom anti-reflective coating (BARC) 16 that may be a cross-linked polymer or a dielectric anti-reflective coating (DARC) such as SiON with thickness h2 of 30-100 nm is deposited on the dielectric layer 14. Next, a photoresist is spin-coated and patterned by photolithography, forming via photoresist patterns 20 with size d1 of approximately 70-80 nm and height h3 of ≥200 nm.

Next, referring to FIG. 2, the anti-reflective coating 16 is completely etched and the dielectric layer 14 is partially etched through using the photoresist pattern by a fluorine carbon-based plasma such as $CF_4$ or $CHF_3$ alone, or mixed with Ar and $N_2$. The layers can also be patterned by a physical etch such as IBE. The partially etched part of the dielectric 14 has a straight profile as defined by the photoresist. The width of the via 22 partially etched into the dielectric layer 14 is d2, about 60-70 nm. The height of the dielectric 14 etched into is h4, about 10 to 90% of the total height h1.

The photoresist 20 and remaining BARC 16 are stripped away by oxygen alone or mixed with $N_2$ or $H_2O$. Referring now to FIG. 3, the remaining dielectric layer 14 is etched by the previously partially patterned part above as a hard mask. Since the photoresist is gone, the dielectric is etched from all directions. Here it is noted that the less the first step of etch time, i.e., the more the second step of etch time, the larger the taper angle will be. For instance, if 50% of the dielectric is etched during the first etch step and the remaining 50% is etched during the second etch step, the resulting top to bottom critical dimension (CD) ratio is about 1.6 with a tapered angle of approximately 45°. The tapered via 24 will have a bottom width d3 of about 40-50 nm and a top width d4 of about 60-80 nm. The taper angle 26 is preferably between about 10 and 80°.

After etching, as shown in FIG. 4, metal 28 such as Ta, TaN, Ti, TiN, W, Cu, Mg, Ru, Cr, Co, Fe, Ni or their alloys is deposited into the vias 24 with a thickness of 70 nm, as assisted by the dielectric's tapered profile. For example, via 24 may have a top and bottom CD of d4=80 and d3=50 nm, respectively.

As illustrated in FIG. 5, CMP is then applied to remove the extra metal on the surface and optionally over polish away some dielectric underneath, with remaining dielectric thickness h5 of ≥50 nm.

Figure 6:
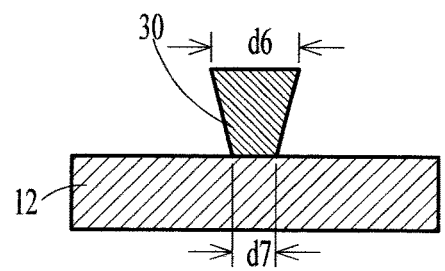

Now, as shown in FIG. 6, the dielectric 14 is stripped off using plasma to expose the entire undercut via 30. Fluorine carbon with low F/C ratio such as $C_4F_8$ can be used to strip off dielectric 14 comprising $SiO_2$ or SiON, $CH_2F_2$ can be used to strip off SiN and SiCN, and $O_2$ can be used to strip off spin-on or amorphous carbon. These gas species together with low bias power (≤100 W) and high source power (≤200 W) ensure that the electrode 30 can stay the same or only shrink by 55 nm after stripping. If a sub 60 nm MTJ is desired, one can use high angle IBE trimming to proportionally decrease the via electrode's top and bottom size, using a high angle of between about 60 and 80°. Another way to achieve a small size electrode 30 is to use a high F/C ratio fluorine carbon such as $CF_4$ plasma with high source ((≥200 W) and low bias (≤100 W) power during the dielectric stripping. This condition provides a moderate etch rate (50-100 nm/min) on metals like Ta, Ti, TaN and TiN, so that with proper over etch, the via electrode's top d6 and bottom d7 size can be trimmed to sub 60 nm and sub 40 nm or sub 30 nm, respectively, maintaining the undercut profile. For either method, ex-situ trimming is used when the metal vias are made of inert metals and in-situ trimming is needed for metals that can be readily oxidized in air.

Figure 7:
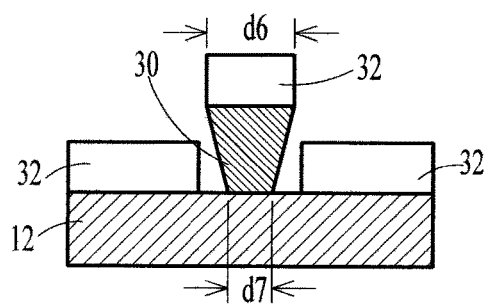

Now, as shown in FIG. 7, MTJ film layers are deposited, typically including a seed layer, a pinned layer, a barrier layer, a free layer, and a cap layer, for example. These layers form the MTJ film stack 32. The MTJ stack 32 can be deposited ex-situ, but preferably, the MTJ stack is deposited in-situ. After the MTJ stack is deposited, it only covers the top of the undercut metal via 30 as well as the original bottom electrode 12 on the sides. It should be noted that the MTJ stack is discontinuous because of the undercut structure 30.

Figure 8:
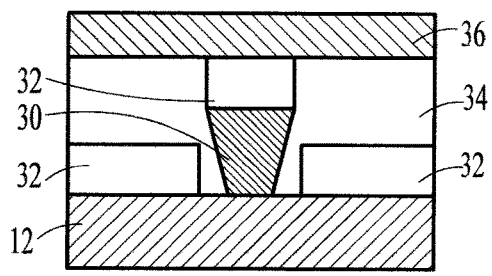

As a result, the MTJ patterns with size d6 (50-60 nm) are formed without etching and thus, without plasma etch-induced chemical damage and/or conductive metal re-deposition on the MTJ sidewalls. Now, as shown in FIG. 8, dielectric layer 34 is deposited and flattened by CMP, for example, wherein the top MTJ surface is exposed. Finally, the top metal electrode 36 is deposited to form the whole device, also preferably in an in-situ method.

In the process of the present disclosure, by decoupling the etch process, we can create a dielectric via with tapered profile which leads to an undercut via electrode to allow for etchless MTJ patterns. This approach avoids any chemical damage and/or conductive metal re-deposition on the MTJ sidewall, thus improving the MRAM device performance.

In the present disclosure, we form sub 60 nm MTJ patterns by depositing MTJ stacks onto the undercut via electrodes, without using plasma to etch them directly. More specifically, the dielectric is partially etched first, forming shallow vias with straight profile. Then the photoresist is stripped off and the second step of etch is continued. During the second step, the first step formed patterns' top corners shrink horizontally, eventually forming vias with a tapered angle after the process is done. Moreover, the less the first step of etch time, i.e., the more the second step of etch time is needed, the larger the taper angle. Therefore the dielectric vias' profile can be precisely controlled by distributing these two steps' etch time. After later metal deposition and CMP, an undercut via electrode is formed, making the etchless MRAM devices possible.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure, the method comprising:
    depositing a first dielectric layer on a bottom electrode;
    partially etching through the first dielectric layer using a photoresist pattern to form a first via opening having straight sidewalls;
    removing the photoresist pattern and etching all the way through the first dielectric layer to the bottom electrode in the first via opening to form a second via opening, wherein the second via opening has tapered sidewalls;
    depositing a metal layer over the first dielectric layer and in the second via opening and thereafter removing the metal layer overlying the first dielectric layer;
    removing remaining portions of the first dielectric layer, wherein the metal-filled second via opening forms an electrode plug on the bottom electrode;
    depositing MTJ stacks on the electrode plug and on the bottom electrode, wherein the MTJ stacks are discontinuous;
    depositing a second dielectric layer over the MTJ stacks;
    polishing the second dielectric layer to expose a top surface of the MTJ stack on the electrode plug; and
    depositing a top electrode layer on the second dielectric layer and contacting the top surface of the MTJ stack on the electrode plug.

2. The method according to claim 1, wherein the first dielectric layer comprises $SiO_2$, SiN, SiON, SiC, SiCN, or carbon having a thickness greater than or equal to 100 nanometers.

3. The method according to claim 1, further comprising:
prior to partially etching through the first dielectric layer,
depositing a bottom anti-reflective coating (BARC) comprising a cross-linked polymer or a dielectric anti-reflective coating (DARC) on the first dielectric layer;
spin-coating a photoresist on the BARC layer; and
patterning the photoresist to form the photoresist pattern having an opening with a width between about 70 nm and about 80 nm.

4. The method according to claim 1, wherein partially etching through the first dielectric layer comprises a fluorine carbon-based plasma alone, or mixed with an argon- or nitrogen-containing fluid, or a physical etch.

5. The method according to claim 1, wherein the tapered via has a bottom width of about 40 to 50 nanometers, a top width of about 60 to 80 nanometers, and a taper angle between about 10 and 80 degrees.

6. The method according to claim 1, wherein the metal layer comprises Ta, Ti, TaN, TiN, W, Cu, Mg, Ru, Cr, Co, Fe, Ni or their alloys.

7. The method according to claim 1, wherein removing the metal overlying the first dielectric layer comprises chemical mechanical polishing.

8. The method according to claim 1, wherein removing remaining portions of the first dielectric layer comprises etching with:
fluorine carbon if the first dielectric layer comprises $SiO_2$ or SiON;
$CH_2F_2$ if the first dielectric layer comprises SiN or SiCN; and
$O_2$ if the first dielectric layer comprises carbon; and
wherein a bias power of less than or equal to 100 Watts and a source power of greater than or equal to 200 Watts is used.

9. The method according to claim 1, further comprising using IBE trimming at an angle of between about 60 and 80 degrees to proportionally decrease the via electrode's top and bottom sizes subsequent to removing remaining portions of the first dielectric layer.

10. The method according to claim 1, wherein the electrode plug has a top width of less than or equal to 60 nanometers and a bottom width of less than or equal to 40 nanometers.

11. A method for fabricating a magnetic tunneling junction (MTJ) structure, the method comprising:
depositing a first dielectric layer on a bottom electrode;
partially etching through the first dielectric layer using a photoresist pattern to form a first via opening having straight sidewalls;
thereafter removing the photoresist pattern and etching all the way through the first dielectric layer to the bottom electrode in the first via opening to form a second via opening, wherein the second via opening has tapered sidewalls;
depositing a metal layer over the first dielectric layer and in the second via opening and thereafter removing the metal layer overlying the first dielectric layer;
removing portions of the first dielectric layer adjacent to the metal in the second via opening, wherein the metal in the second via opening forms an electrode plug on the bottom electrode;
thereafter IBE trimming the electrode plug to proportionally decrease a top width and a bottom width of the via electrode to less than or equal to 60 nanometers and a less than or equal to 40 nanometers, respectively;
thereafter depositing MTJ stacks on the electrode plug and on the bottom electrode, wherein the MTJ stacks are discontinuous;
depositing a second dielectric layer over the MTJ stacks;
polishing the second dielectric layer to expose a top surface of the MTJ stack on the electrode plug; and
thereafter depositing a top electrode layer on the second dielectric layer and contacting the top surface of the MTJ stack on the electrode plug.

12. The method according to claim 11, wherein the first dielectric layer comprises $SiO_2$, SiN, SiON, SiC, SiCN, or carbon having a thickness greater than or equal to 100 nanometers.

13. The method according to claim 11, further comprising:
prior to partially etching through the first dielectric layer, depositing a bottom anti-reflective coating (BARC) comprising a cross-linked polymer or a dielectric anti-reflective coating (DARC) having a thickness between 30 nanometers and 100 nanometers on the first dielectric layer;
spin-coating a photoresist on the BARC layer; and
patterning the photoresist to form the photoresist pattern having an opening with a width between about 70 nm and about 80 nm.

14. The method according to claim 11, wherein partially etching through the first dielectric layer comprises a fluorine carbon-based plasma alone, or mixed with an argon- or nitrogen-containing fluid, or a physical etch.

15. The method according to claim 11, wherein the tapered via has a bottom width of about 40 to 50 nanometers, a top width of about 60 to 80 nanometers, and a taper angle between about 10 and 80 degrees.

16. The method according to claim 11, wherein the metal layer comprises Ta, Ti, TaN, TiN, W, Cu, Mg, Ru, Cr, Co, Fe, Ni or their alloys.

17. The method according to claim 11, wherein removing the metal overlying the first dielectric layer comprises chemical mechanical polishing.

18. The method according to claim 11, wherein removing portions of the first dielectric layer adjacent to the metal in the second via opening comprises etching with:
fluorine carbon if the first dielectric layer comprises $SiO_2$ or SiON;
$CH_2F_2$ if the first dielectric layer comprises SiN or SiCN; and
$O_2$ if the first dielectric layer comprises carbon; and
wherein a bias power of less than or equal to 100 Watts and a source power of greater than or equal to 200 Watts is used.

19. The method according to claim 11, wherein the IBE trimming is performed at an angle of between about 60 and 80 degrees.

20. The method according to claim 11, wherein removing portions of the first dielectric layer adjacent to the metal in the second via opening comprises etching the electrode plug at an etch rate of between 50 nanometers per minute and 100 nanometers per minute.

* * * * *